United States Patent
Hsu et al.

(10) Patent No.: US 7,186,611 B2
(45) Date of Patent: Mar. 6, 2007

(54) HIGH-DENSITY GERMANIUM-ON-INSULATOR PHOTODIODE ARRAY

(75) Inventors: Sheng Teng Hsu, Camas, WA (US); Jong-Jan Lee, Camas, WA (US); Jer-Shen Maa, Vancouver, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/240,969

(22) Filed: Sep. 30, 2005

(65) Prior Publication Data

US 2006/0194357 A1    Aug. 31, 2006

Related U.S. Application Data

(63) Continuation-in-part of application No. 11/069,424, filed on Feb. 28, 2005, now Pat. No. 7,008,813, and a continuation-in-part of application No. 11/174,035, filed on Jul. 1, 2005.

(51) Int. Cl.
*H01L 21/329* (2006.01)

(52) U.S. Cl. ............... 438/237; 438/141; 438/328; 257/233; 257/577; 257/594; 257/601; 257/656

(58) Field of Classification Search ............... 257/233, 257/577, 594, 601, 656, E27.051, E27.133, 257/E29.327, E29.336; 438/141, 237, 328, 438/FOR. 415
See application file for complete search history.

(56) References Cited

U.S. PATENT DOCUMENTS

| | | | | |
|---|---|---|---|---|
| 4,514,748 A | * | 4/1985 | Bean et al. | 257/184 |
| 5,604,136 A | * | 2/1997 | Fang et al. | 438/24 |
| 5,714,772 A | * | 2/1998 | Fang et al. | 257/82 |
| 6,452,218 B1 | * | 9/2002 | Cao | 257/103 |
| 7,008,813 B1 | * | 3/2006 | Lee et al. | 438/56 |

OTHER PUBLICATIONS

Yaocheng Liu, Kailash Gopalakrishnan, Peter B. Griffin, Kai Ma, Michael D. Deal, and James D. Plummer, "MOSFETs and High-Speed Photodetectors on Ge-on Insulator Substrates" 2004 IEDM Technical digest p. 1001-1004.

* cited by examiner

*Primary Examiner*—George R. Fourson
*Assistant Examiner*—Joannie Adelle Garcia
(74) *Attorney, Agent, or Firm*—Law Office of Gerald Maliszewski; Gerald Maliszewski

(57) ABSTRACT

A high-density Germanium (Ge)-on-Insulator (GOI) photodiode array and corresponding fabrication method are provided. The method includes: forming an array of pixel driver nMOST devices, each device having a gate connected to a row line in a first orientation, a first source/drain (S/D) region, and a second S/D region connected to Vdd; forming a P-I-N Ge diode for each pixel as follows:

forming a n+ region;

forming an intrinsic Ge region overlying the n+ region;

forming a p+ junction in the intrinsic Ge; and, isolating the P-I-N Ge diodes; and, forming an Indium Tin oxide (ITO) column in a second orientation, about orthogonal to the first orientation, overlying the P-I-N Ge diodes.

19 Claims, 6 Drawing Sheets

US 7,186,611 B2

HIGH-DENSITY GERMANIUM-ON-INSULATOR PHOTODIODE ARRAY

RELATED APPLICATIONS

This application is a Continuation-in-Part of a patent application entitled, METHOD OF EPITAXIAL GROWTH OF GERMANIUM PHOTODETECTOR FOR CMOS IMAGER, Lee et al., Ser. No. 11/069,424, filed Feb. 28, 2005. Now U.S. Pat. No. 7,008,813.

This application is a Continuation-in-Part of a pending patent application entitled, FLOATING BODY GERMANIUM PHOTOTRANSISTOR, Lee et al., Ser. No. 11/174,035, filed Jul. 1, 2005.

Both these copending applications are incorporated herein by reference.

BACKGROUND OF THE INVENTION

1. Field of the Invention

This invention generally relates to semiconductor fabrication processes and, more particularly, to a high-density Germanium-on-insulator (GOI) photodiode.

2. Description of the Related Art

FIG. 1 is a Cross-Sectional Transmission Electron Microscopy (XTEM) image of an interface between Germanium (Ge) and $Si_3N_4$. The Ge film has been regrown by liquid phase epitaxy. In a copending application entitled METHOD OF EPITAXIAL GROWTH OF GERMANIUM PHOTODETECTOR FOR CMOS IMAGER, invented by Lee et al., a method for growing single crystalline Ge film by liquid phase epitaxy is presented, along with a means of fabricating a PIN photo detector for infrared photon detection. However, it is noted that the interface between Ge single crystal and the bottom dielectric layer ($Si_3N_4$) is not perfect, as shown in the TEM image. This interface may potentially cause leakage current in the diode. This interface is likely the result of the Ge PIN diode using the entire Ge film, so that the bottom interface degrades the electrical performance.

It has also proven difficult to form a dense array of Ge-on-silicon photodiode structures. A diode structure with a high-density yield would be beneficial for CMOS imager fabrication. To that end, it would be beneficial if a Ge diode array could be fabricated with a minimum width isolation between diodes, corresponding to the minimum-sized features of a MOS transistor.

SUMMARY OF THE INVENTION

Accordingly, a method is provided for forming a high-density Germanium (Ge)-on-Insulator (GOI) photodiode array. The method comprises: forming an array of pixel driver nMOST devices, each device having a gate connected to a row line in a first orientation, a first source/drain (S/D) region, and a second S/D region connected to Vdd; forming a P-I-N Ge diode for each pixel as follows:
  forming a n+ region;
  forming an intrinsic Ge region overlying the n+ region;
  forming a p+ junction in the intrinsic Ge; and,
  isolating the P-I-N Ge diodes; and,
  forming an Indium Tin oxide (ITO) column in a second orientation, about orthogonal to the first orientation, overlying the P-I-N Ge diodes.

In one aspect, the n+ region is formed as follows: forming a planarized layer of oxide overlying the nMOST device, with a top surface; forming a contact hole through the planarized oxide to the first S/D region; and, epitaxially growing Ge in the contact hole. Ge can be formed in the contact hole by either selectively growing n+ doped Ge or growing intrinsic Ge, followed by an n+ ion implantation.

In one aspect, a Silicon nitride (SiN) placeholder is deposited overlying the n+ region. Then, isolating the P-I-N Ge diodes includes: selectively etching the SiN placeholder and the n+ region to form an isolation trench; and, filling the isolation trench with oxide. Further, forming the intrinsic Ge region overlying the n+ region further includes: etching to remove the SiN placeholder; and, epitaxially growing Ge from the n+ region.

Additional details of the above-described method, a method for forming a high-density Germanium GOI photodiode array with pMOST devices, and a corresponding GOI array structures are provided below.

DETAILED DESCRIPTION

Figure 1:
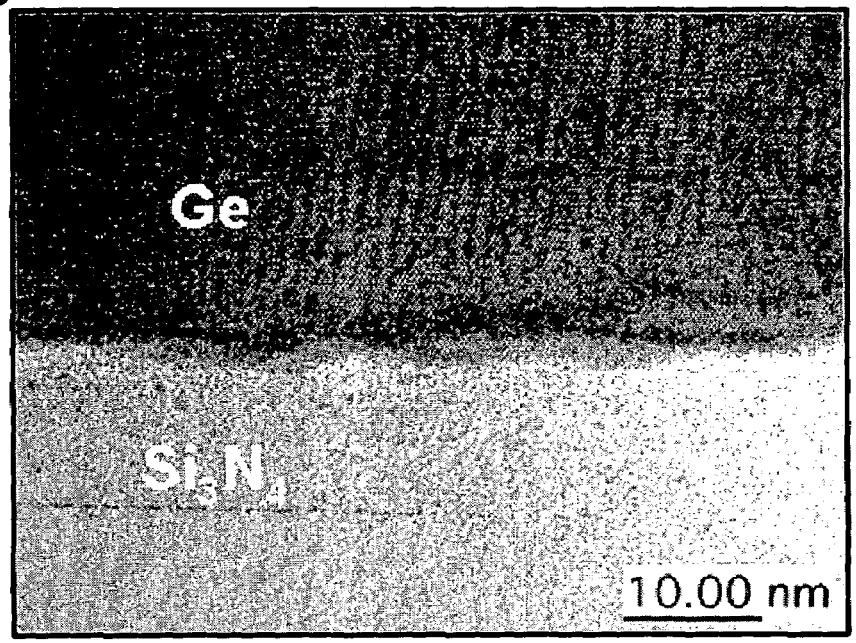
FIG. 1 is a Cross-Sectional Transmission Electron Microscopy (XTEM) image of an interface between Germanium (Ge) and $Si_3N_4$.
Figure 2:
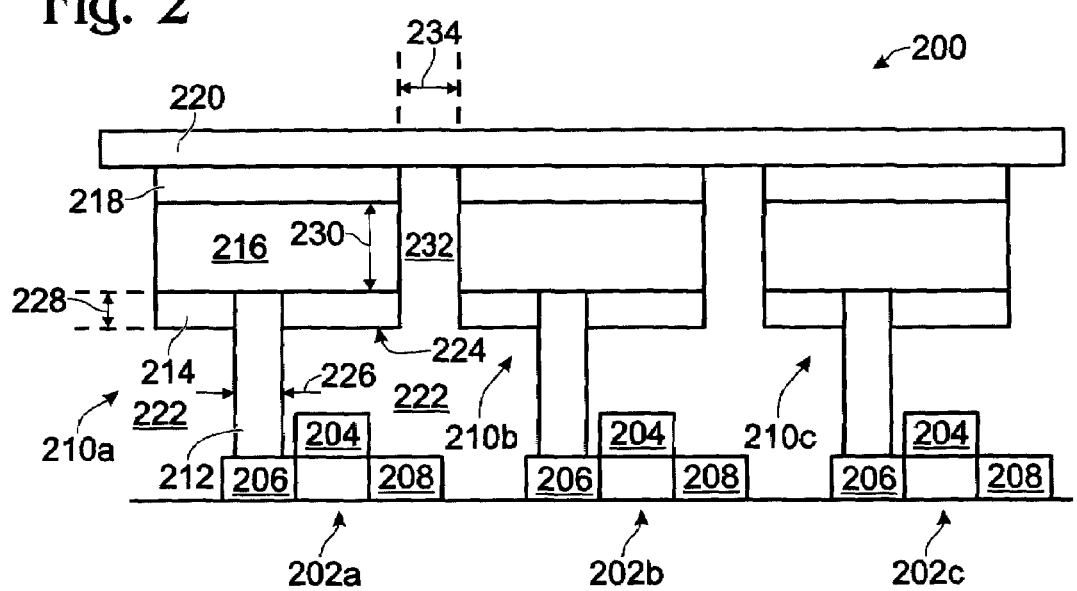
FIG. 2 is a partial cross-sectional view of a high-density Germanium (Ge)-on-Insulator (GOI) photodiode array, made with nMOST devices.

FIG. 2 is a partial cross-sectional view of a high-density Germanium (Ge)-on-Insulator (GOI) photodiode array, made with nMOST devices. The array 200 comprises a first plurality of pixel driver nMOST devices 202, with gates 204 connected to a second plurality of row lines in a first orientation (looking into the page). Shown are devices 202a, 202b, and 202c forming of an array column. In this example the second plurality equals three. However, the array is not limited to any particular number of devices per column. Each device 202 has a first source/drain (S/D) region 206, and a second S/D region 208 connected to Vdd.

The array 200 further comprises a first plurality of P-I-N Ge diodes 210. Shown are diodes 210a, 210b, and 210c, corresponding to devices 202a, 202b, and 202c, respectively. It should be understood that the first plurality equals the total number of diodes 210 (or devices 202) in the array 200. Each diode 210, as represented by diode 210a, comprises an n+ Ge via 212 overlying the first S/D 206 of the corresponding device 202 (in this case, 202a). An n+ layer 214 overlies the n+ via 212. An intrinsic Ge layer 216 overlies the n+ layer 214. A p+ Ge layer 218 overlies the intrinsic Ge layer 216.

A third plurality of Indium Tin oxide (ITO) columns 220 are formed in a second orientation (along the surface of the page), about orthogonal to the first orientation. Although only a single column is specifically shown, it should be understood that the array 200 includes other, parallely aligned columns. Each column 220 overlies the third plurality of P-I-N Ge diodes 210. Alternately stated, the first plurality of diodes 210 (or devices 202) equals the number of columns times the number or rows.

A planarized layer of oxide 222 overlies the nMOST device 202, with a top surface 224. The n+ Ge via 212 is formed in a contact hole 226 from the planarized oxide top surface 224 to the first S/D region 206. In one aspect, the n+ Ge via 212 is epitaxially grown Ge.

The n+ layer 214 can be an Antimony (Sb)-doped Ge with a thickness 228 of about 10 to about 30 nanometers (nm), Sb-doped Silicon oxide (NSG) with a thickness 228 of about 50 to about 100 nm, or planarized oxide implanted with Sb with a thickness of about 0.01 to 0.05 micrometers.

Typically, the intrinsic Ge layer 216 has a thickness 230 in the range of about 500 to 3000 nm. The intrinsic Ge layer can either be an amorphous Ge and epitaxially grown Ge material.

A Silicon oxide-filled isolation trench 232 separates adjacent P-I-N diodes. The isolation trench 232 has a trench width 234 that can be made as small as the minimum feature size of the photodiode array fabrication process.

Figure 3:
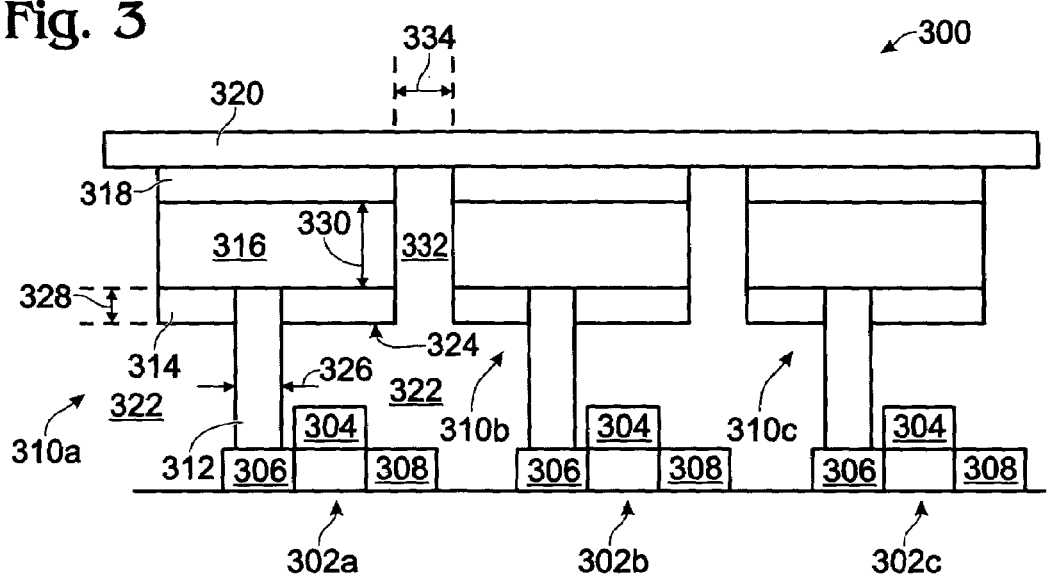
FIG. 3 is a partial cross-sectional view of a GOI photodiode array, made with pMOST devices.
Figure 4:
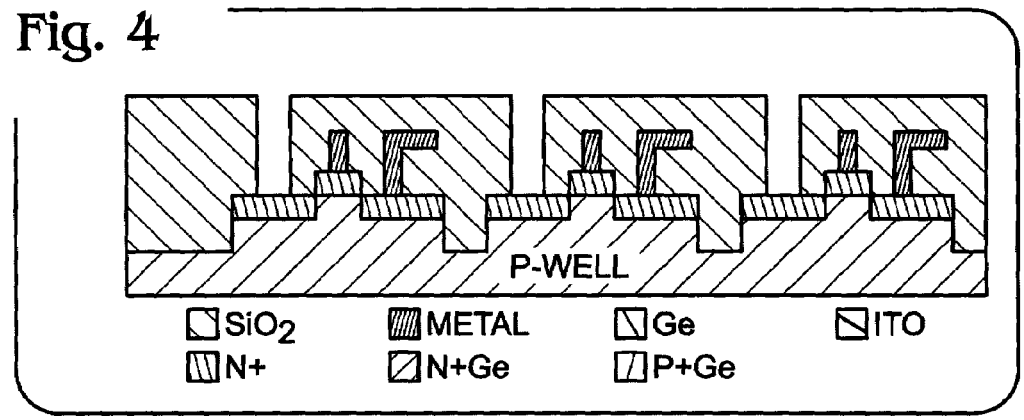
FIGS. 4 through 9 depict steps in a high-density GOI photodiode array fabrication process.
Figure 5:
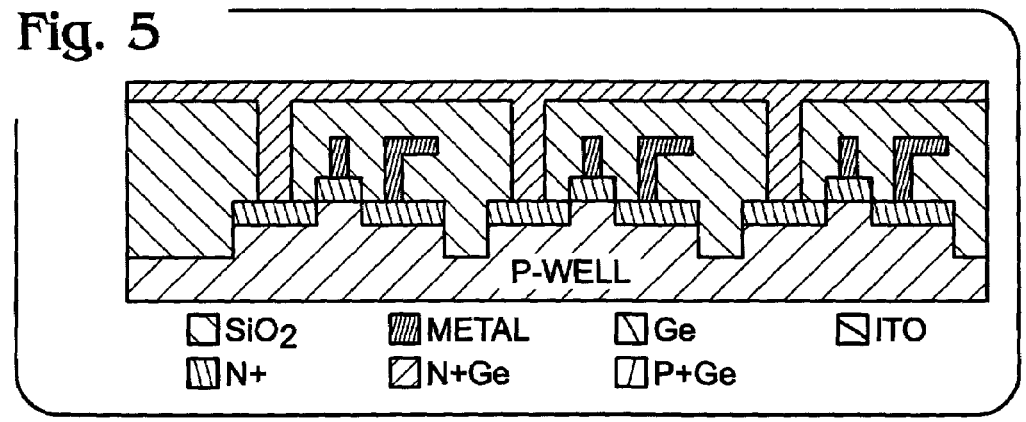
Figure 6:
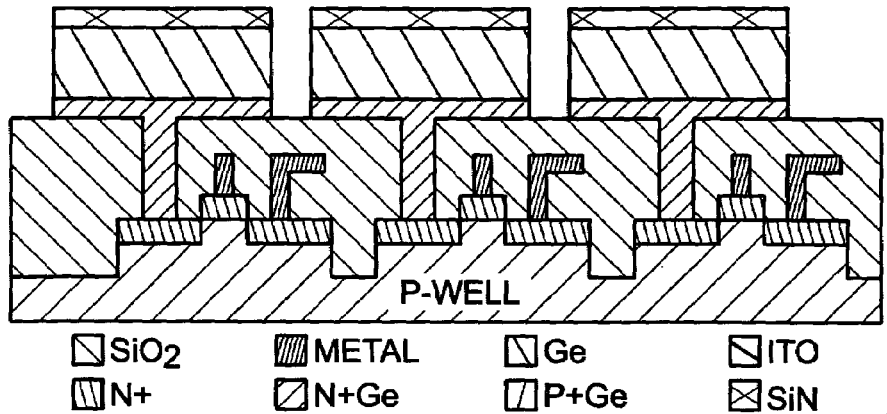
Figure 7:
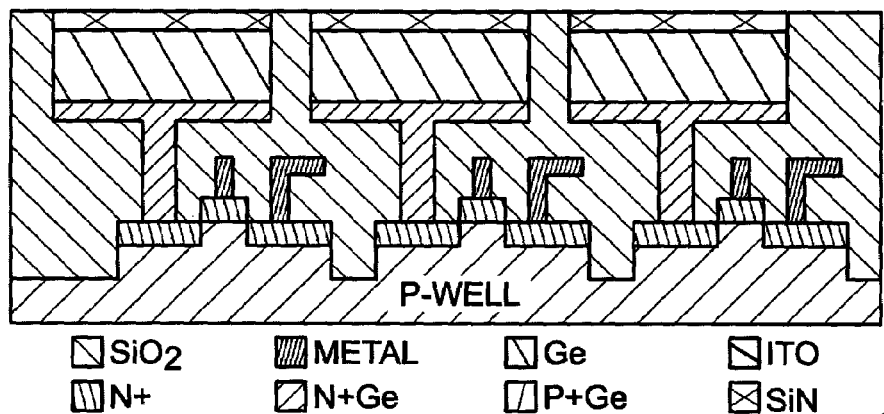
Figure 8:
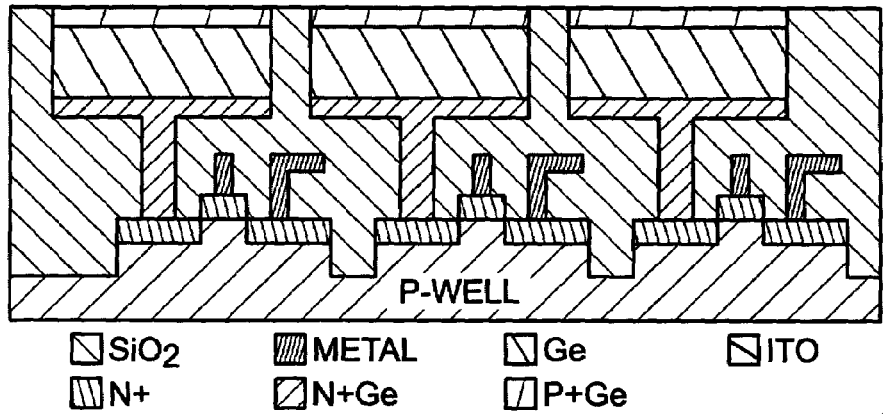

FIG. 3 is a partial cross-sectional view of a GOI photodiode array, made with pMOST devices. The array 300 comprises a first plurality of pixel driver pMOST devices 302a, 302b, and 302c, with gates 304 connected to a second plurality of row lines in a first orientation. Each device 302 has a first source/drain (S/D) region 306, and a second S/D region 308 connected to Vdd.

The array 300 comprises a first plurality of N-I-P Ge diodes 310a, 310b, and 310c. As represented by diode 310a, each diode comprises a p+ Ge via 312 overlying the first S/D 306 of corresponding device 302a. A p+ layer 314 overlies the p+ via 312. An intrinsic Ge layer 316 overlies the p+ layer 314. An n+ Ge layer 318 overlies the intrinsic Ge layer 316. A third plurality of ITO columns 320 (one is shown) are oriented in a second orientation, about orthogonal to the first orientation, overlying the third plurality of N-I-P Ge diodes (the number of rows) in each column.

Additional details, such as the layer thicknesses, are about the same as for the nMOST device array of FIG. 2, and are not repeated here in the interest of brevity.

FUNCTIONAL DESCRIPTION

FIGS. 4 through 9 depict steps in a high-density GOI photodiode array fabrication process. Any conventional state-of-the-art process can be used to fabricate silicon CMOS transistors. One nMOST per pixel is shown for the sake of maximum density. However, it should be understood that a pixel may include more than one transistor. After the fabrication of the silicon CMOS and the first interconnect metal, the first layer of Silicon oxide is deposited and CMP planarized. The n+ source doping density of the nMOST pixel is relatively low in order to avoid crystalline defect.

1. Photoresist and selectively etch the oxide to form a contact from the source of pixel driver nMOST to Ge PIN diode. See FIG. 4, where the wafer ready for selective Ge epitaxial growth.

2. Selectively grow, in situ, doped epitaxial (epi) Ge to fill the contact holes. Optionally, the Ge epi may be intrinsic followed by n+ ion implantation. Although not necessary, preferably the contact hole is overfilled.

3. Deposit about 10 to 30 nm of amorphous Ge. Implant Antimony (Sb) to dope amorphous Ge n+. The Antimony energy is about 20 keV to about 50 keV, and the dose is about $2 \times 10^{13}$ to about $1 \times 10^{15}/cm^2$. Alternatively, implant the Antimony onto Silicon oxide without the thin Ge amorphous layer, or deposit about 50 nm to about 100 nm of heavily Antimony doped oxide (NSG). See FIG. 5, where a layer of n+ amorphous Ge is formed on the wafer.

4. Deposit 500 nm to 3000 nm of amorphous Ge, and a SiN cap with a thickness in the range of about 10 nm to 50 nm.

5. Photoresist, and selectively etch the SiN cap, amorphous Ge, n+ Ge (or n+ oxide) to form isolation trenches. The trench width is the minimum feature size width. That is, the minimum trench width is the minimum feature size of the given process. See FIG. 6, after the isolation trench etch.

6. Deposit silicon oxide. CMP polish the oxide, stopping at the nitride. See FIG. 7, after the refill of the isolation trenches with Silicon oxide.

7. Rapid thermal anneal (RTA) at a temperature of about 930° C. to 1000° C. for about 0 to 5 seconds. A zero second duration means that when the RTA temperature reaches the target temperature, it is immediately cooled down.

8. Etch the Silicon nitride. Implant Indium to form a shallow p+ junction. The energy is about 30 to 50 keV. The dose is about $5 \times 10^{13}$ to about $1 \times 10^{15}/cm^2$. Anneal to activate Indium ions at about 500 to 800° C. for about 10 seconds to about 10 minutes. See FIG. 8, after Indium ion implantation.

9. Deposit the ITO. Photoresist and selectively etch the ITO.

10. Follow any conventional state-of-the-art process for metallization to complete the wafer fabrication. See FIG. 9, a cross-sectional view of the final structure.

Figure 9:
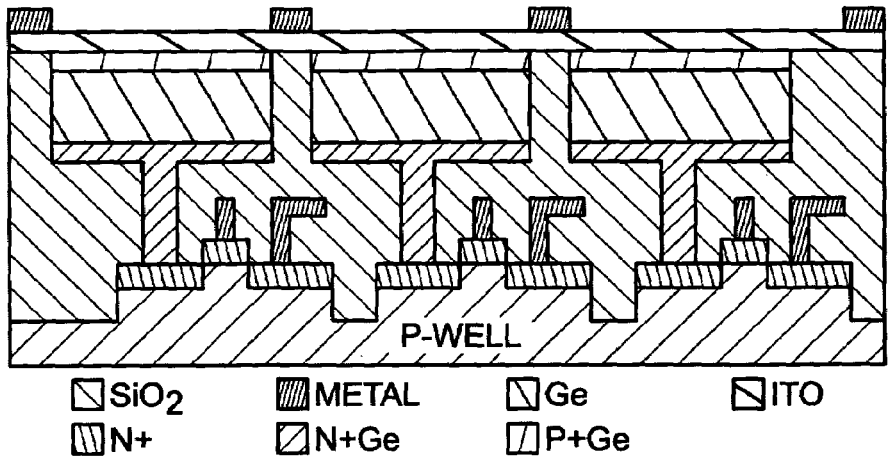
Figure 10:
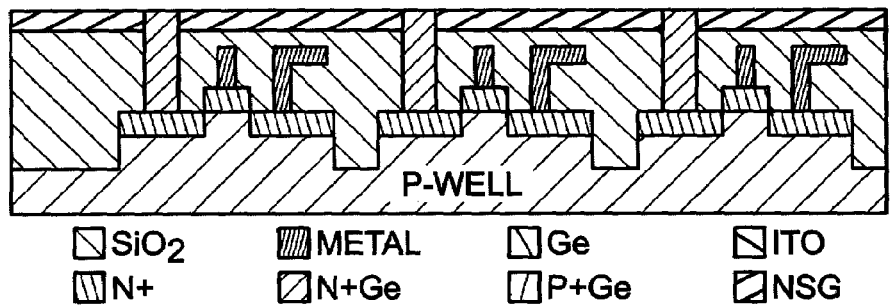
FIGS. 10 through 13 depict a variation in the GOI photodiode fabrication process.
Figure 11:
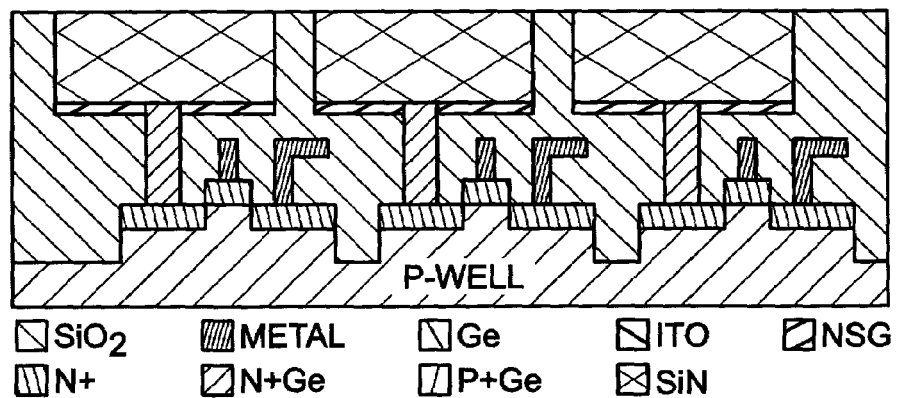
Figure 12:
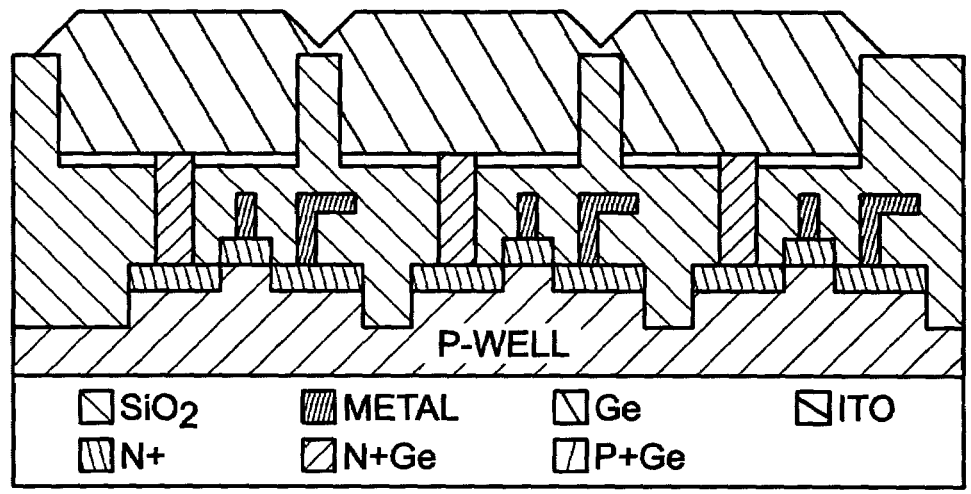
Figure 13:
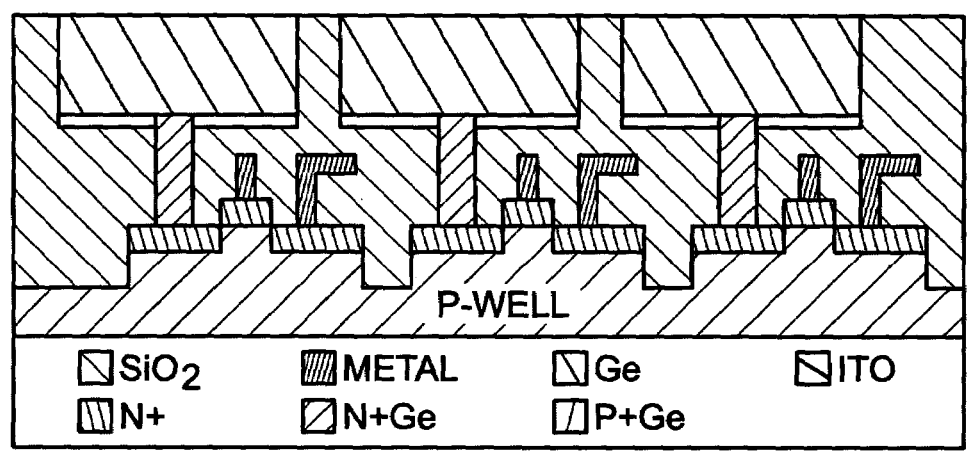

The transparent metal ITO of each pixel, as shown in FIG. 9, is connected together. As would be understood by one skilled in the art, the top transparent electrode of each row (i.e., the x-direction looking into the page) of diodes may connected together if the gate of the driver nMOSTs of each column (i.e., the y-direction across the surface of the page) is connected together to provide an additional bias to the diode which may increase the efficiency of the photo detector. The metal lines run between the diodes on the top of the isolation oxide to avoid blocking light incident to the diodes.

FIGS. 10 through 13 depict a variation in the GOI photodiode fabrication process. In order to avoid up diffusion of the Antimony during the Liquid Phase Epitaxial (LPE) process, an Epitaxial Lateral Overgrowth (ELO) process may be used instead. The ELO process is performed as follows:

1. Follow the above-mentioned processes for the fabrication of silicon CMOS circuits and the first oxide planarization (Step 1, above).

2. Perform an Antimony ion implantation onto the silicon oxide. The Antimony energy is about 20 keV to about 50 keV, and the dose is about $2 \times 10^{13}$ to about $1 \times 10^{15}/cm^2$. Alternately, deposit about 50 to 100 nm of heavily Antimony doped oxide (NSG).

3. Photoresist and selectively etch contact holes for the Ge P-I-N diode-to-MOST contact. Selective epi grow n+ doped Ge to approximately fill the contact holes. See FIG. 10, after an Antimony implant or NSG deposition, and growth of n+ Ge.

4. Deposit about 500 to 3000 nm of Silicon nitride as a placeholder for the active Ge diodes.

5. Photoresist and selectively etch Silicon nitride and NSG. Deposit Silicon oxide and perform CMP planarization. See FIG. 11, after diode isolation oxide planarization.

6. Etch the Silicon nitride and perform epitaxial lateral overgrowth of Ge, to replace the removed placeholders. See FIG. 12, after ELO of Ge.

7. CMP the Ge, stopping at the Silicon oxide. See FIG. 13, after Ge CMP.

At this point, follow Step 8 of the above-mentioned LPE processes associated with FIGS. 5 through 9. The annealing in Step 8 causes Indium to "up diffuse" into the Ge. After step 8, the cross-sectional view ELO process is the same as the LPE process of FIG. 8.

The remaining process steps are the same as that of Step 9 and Step 10 of the LPE process described above. The final device cross-sectional view is the same as that of FIG. 9.

Figure 14:
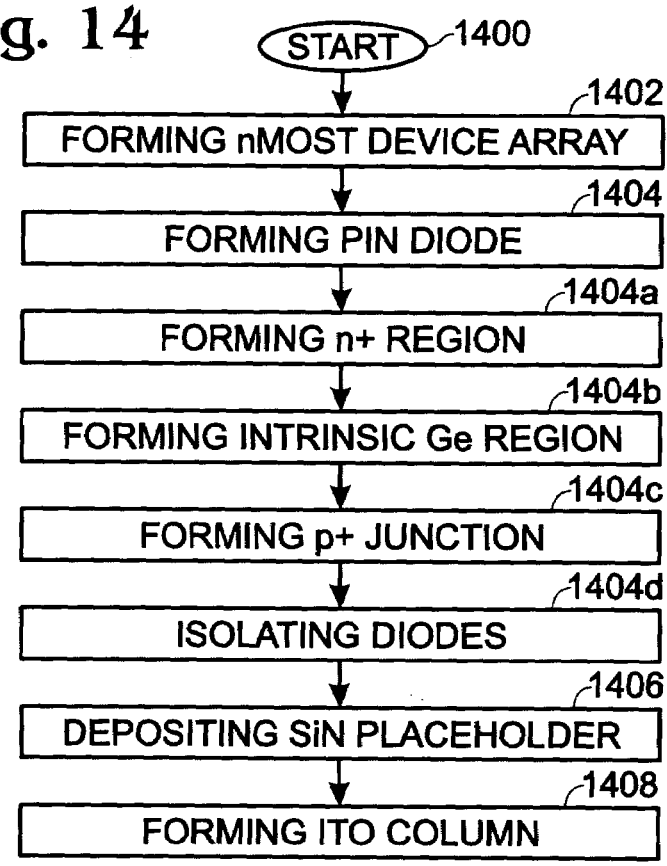
FIG. 14 is a flowchart illustrating a method for forming a high-density GOI photodiode array using nMOST devices.

FIG. 14 is a flowchart illustrating a method for forming a high-density GOI photodiode array using nMOST devices. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 forms an array of pixel driver nMOST devices, each device having a gate connected to a row line in a first orientation, a first source/drain (S/D) region, and a second S/D region connected to Vdd. Step 1404 forms a P-I-N Ge diode for each pixel with the following substeps. Step 1404*a* forms an n+ region. Step 1404*b* forms an intrinsic Ge region overlying the n+ region. Step 1404*c* forms a p+ junction in the intrinsic Ge, and Step 1404*d* isolates the P-I-N Ge diodes. In some aspects Step 1404*c* forms an isolation trench having a width equal to the minimum feature size of the photodiode array fabrication process.

Step 1406 deposits a Silicon nitride (SiN) placeholder, having a thickness in the range of about 500 to 3000 nm, overlying the n+ region. Step 1408 forms an Indium Tin oxide (ITO) column in a second orientation, about orthogonal to the first orientation, overlying the P-I-N Ge diodes.

In one aspect, forming the n+ region in Step 1404*a* includes the following substeps (not shown). Step 1404*a*1 forms a planarized layer of oxide overlying the nMOST device, with a top surface. Step 1404*a*2 forms a contact hole through the planarized oxide to the first S/D region. Step 1404*a*3 epitaxially grows Ge in the contact hole. Step 1404*a*3 can be performed by either selectively growing n+ doped Ge in the contact hole, or growing intrinsic Ge, followed by an n+ ion implantation.

Alternately, forming the n+ region in Step 1404*a* includes the following substeps (not shown). Step 1404*a*4 deposits an amorphous Ge layer overlying the planarized oxide top surface, having a thickness in the range of about 10 to 30 nanometers (nm). Step 1404*a*5 implants Sb with an energy in the range of about 20 to 50 keV, at a dose in the range of about $2\times10^{13}$ to about $1\times10^{15}$ per square centimeter (/cm$^2$). Then, Step 1404 etches to form a contact hole through the planarized oxide to the first S/D region.

As another alternative, forming the n+ region in Step 1404*a* includes a using one of the two following processes. In the first process, Sb is implanted into the planarized oxide with energy in the range of about 20 to 50 keV, at a dose in the range of about $2\times10^{13}$ to about $1\times10^{15}$/cm$^2$. In the second process, a heavily Sb-doped oxide (NSG) is deposited overlying the planarized oxide top surface, having a thickness in the range of about 50 to 100 nm. Following either process, Step 1404*a* etches to form contact holes through the planarized oxide to the first S/D region.

In one aspect, isolating the P-I-N Ge diodes in Step 1404*d* includes addition substeps (not shown). Step 1404*d*1 selectively etches the SiN placeholder and the n+ region to form an isolation trench. Step 1404*d*2 fills the isolation trench with oxide. Then, forming the intrinsic Ge region overlying the n+ region further in Step 1404*b* includes the following substeps (not shown). Step 1404*b*1 etches to remove the SiN placeholder. Step 1404*b*2 epitaxially grows Ge from the n+ region.

In another aspect, Step 1404*b* forms an intrinsic Ge region overlying the n+ region by depositing amorphous Ge having a thickness in the range of about 500 to 3000 nm. Then, isolating the P-I-N Ge diodes in Step 1404*d* includes the following substeps (not shown). Step 1404*d*3 deposits a SiN cap overlying the amorphous Ge, having a thickness in the range of about 10 to 50 nm. Step 1404*d*4 selectively etches the SiN cap, amorphous Ge, and n+ region, forming an isolation trench. Step 1404*d*5 fills the isolation trench with oxide. Step 1404*d*6 rapid thermal anneals, and Step 1404*d*7 etches to remove the SiN.

In a different aspect, forming the p+ junction in the intrinsic Ge in Step 1404*c* includes the following substeps (not shown). Step 1404*c*1 implants Indium with an energy in the range of about 30 to 50 keV, at a dose in the range of about $5\times10^{13}$ to about $1\times10^{15}$/cm$^2$. Step 1404*c*2 anneals at a temperature in the range of about 500 to 800° C., for a time duration in the range of about 10 second to about 10 minutes.

Figure 15:
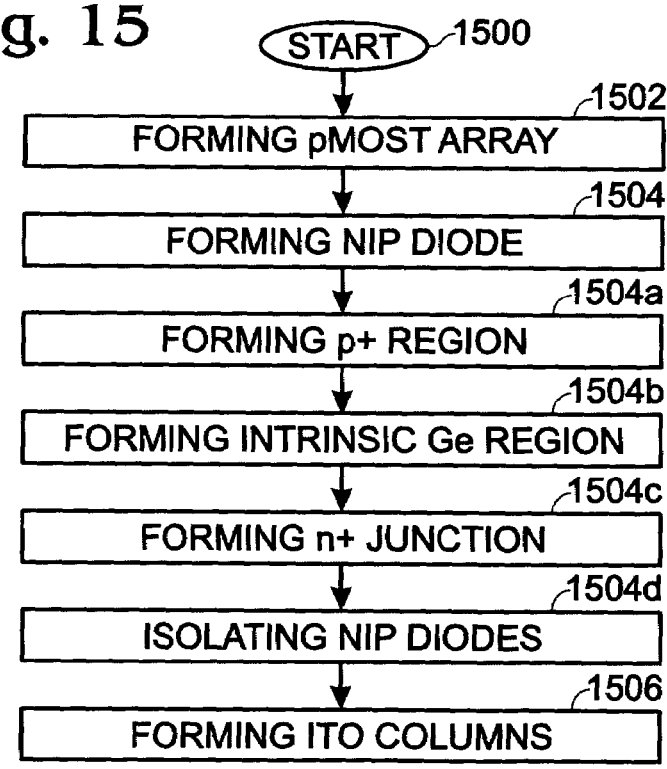
FIG. 15 is a flowchart illustrating a method for forming a high-density germanium GOI photodiode array using pMOST devices.

FIG. 15 is a flowchart illustrating a method for forming a high-density Germanium GOI photodiode array using pMOST devices. The method starts at Step 1500. Step 1502 forms an array of pixel driver pMOST devices, each device having a gate connected to a row line in a first orientation, a first source/drain (S/D) region, and a second S/D region connected to Vdd. Step 1504 forms a N-I-P Ge diode for each pixel using the following substeps. Step 1504*a* forms a p+ region. Step 1504*b* forms an intrinsic Ge region overlying the p+ region. Step 1504*c* forms an n+ junction in the intrinsic Ge. Step 1504*d* isolates the N-I-P Ge diodes. Step 1506 forms an Indium Tin oxide (ITO) column in a second orientation, about orthogonal to the first orientation, overlying the N-I-P Ge diodes. Details of the method of FIG. 15 are similar to the method described by FIG. 14, and will not be repeated here in the interest of brevity.

A high-density Germanium GOI photodiode array and corresponding fabrication method have been provided. The invention has been explained in the context of exemplary materials, processes, and layer thickness. However, the invention is not limited to merely these examples. Other variations and embodiments of the invention will occur to those skilled in the art.

We claim:

1. A method for forming a high-density Germanium (Ge)-n-Insulator (GOI) photodiode array, the method comprising:

forming an array of pixel driver nMOST devices, each device having a gate connected to a row line in a first orientation, a first source/drain (S/D) region, and a second S/D region connected to Vdd;

forming a P-I-N Ge diode for each pixel as follows:
  forming a n+ region;
  forming an intrinsic Ge region overlying the n+ region;
  forming a p+ junction in the intrinsic Ge region; and,
  isolating the P-I-N Ge diodes; and, forming an Indium Tin oxide (ITO) column in a second orientation, about orthogonal to the first orientation, overlying the P-I-N Ge diodes.

2. The method of claim 1 wherein forming the n+ region includes:

forming a planarized layer of oxide overlying the nMOST device, with a top surface;

forming a contact hole through the planarized oxide to the first S/D region; and, epitaxially growing Ge in the contact hole.

3. The method of claim 2 wherein epitaxially growing Ge in the contact hole includes a using a process selected from the group including:
   selectively growing n+ doped Ge in the contact hole; and
   growing intrinsic Ge, followed by an n+ ion implantation.

4. The method of claim 2 wherein forming the n+ region includes:
   depositing an amorphous Ge layer overlying the planarized oxide top surface, having a thickness in the range of about 10 to 30 nanometers (nm);
   implanting Antimony (Sb) with an energy in the range of about 20 keV to about 50 keV, at a dose in the range of about $2 \times 10^{13}$ to about $1 \times 10^{15}$ per square centimeter (/cm$^2$);
   followed by an etching to form contact holes through the planarized oxide to the first S/D region.

5. The method of claim 2 wherein forming the n+ region includes a using a process selected from the group comprising:
   implanting Sb into the planarized oxide with an energy in the range of about 20 keV to about 50 keV, at a dose in the range of about $2 \times 10^{13}$ to about $1 \times 10^{15}$/cm$^2$; and,
   depositing a heavily Sb-doped oxide (NSG) overlying the planarized oxide top surface, having a thickness in the range of about 50 to 100 nm;
   followed by an etching to form contact holes through the planarized oxide to the first S/D region.

6. The method of claim 2 further comprising:
   depositing a Silicon nitride (SiN) placeholder, having a thickness in the range of about 500 to 3000 nm, overlying the n+ region;
   wherein isolating the P-I-N Ge diodes includes:
      selectively etching the SiN placeholder and the n+ region to form an isolation trench; and,
      filling the isolation trench with oxide;
   wherein forming the intrinsic Ge region overlying the n+ region further includes:
      etching to remove the SiN placeholder; and,
      epitaxially growing Ge from the n+ region.

7. The method of claim 1 wherein forming the intrinsic Ge region overlying the n+ region includes depositing amorphous Ge having a thickness in the range of about 500 to 3000 nm.

8. The method of claim 7 wherein isolating the P-I-N Ge diodes includes:
   depositing a SiN cap overlying the amorphous Ge, having a thickness in the range of about 10 to 50 nm;
   selectively etching the SiN cap, amorphous Ge, and n+ region, forming an isolation trench;
   filling the isolation trench with oxide;
   rapid thermal annealing; and,
   etching to remove the SiN cap.

9. The method of claim 1 wherein forming the p+ junction in the intrinsic Ge region includes:
   implanting Indium with an energy in the range of about 30 to 50 keV, at a dose in the range of about $5 \times 10^{13}$ to about $1 \times 10^{15}$/cm$^2$; and,
   annealing at a temperature in the range of about 500 to 800° C., for a time duration in the range of about 10 second to about 10 minutes.

10. The method of claim 1 wherein isolating the P-I-N Ge diodes includes forming an isolation trench having a width equal to the minimum feature size of the photodiode array fabrication process.

11. A method for forming a high-density Germanium (Ge)-on-Insulator (GOI) photodiode array, the method comprising:
   forming an array of pixel driver pMOST devices, each device having a gate connected to a row line in a first orientation, a first source/drain (S/D) region, and a second S/D region connected to Vdd;
   forming a N-I-P Ge diode for each pixel as follows:
      forming a p+ region;
      forming an intrinsic Ge region overlying the p+ region;
      forming a n+ junction in the intrinsic Ge region; and, isolating the N-I-P Ge diodes; and,
   forming an Indium Tin oxide (ITO) column in a second orientation, about orthogonal to the first orientation, overlying the N-I-P Ge diodes.

12. A high-density Germanium (Ge)-on-Insulator (GOI) photodiode array, the array comprising:
   a first plurality of pixel driver nMOST devices with gates connected to a second plurality of row lines in a first orientation, each device having a first source/drain (S/D) region, and a second S/D region connected to Vdd;
   a first plurality of P-I-N Ge diodes, each diode comprising:
      an n+ Ge via overlying the first S/D region of a corresponding device;
      an n+ layer overlying the n+ Ge via;
      an intrinsic Ge layer overlying the n+ layer;
      a p+ Ge layer overlying the intrinsic Ge layer; and,
   a third plurality of Indium Tin oxide (ITO) columns in a second orientation, about orthogonal to the first orientation, overlying the P-I-N Ge diodes in the second plurality of row lines.

13. The array of claim 12 further comprising:
   a planarized layer of oxide overlying the nMOST device, with a top surface;
   wherein the n+ Ge via is formed in a contact hole from the planarized oxide top surface to the first S/D region; and,
   wherein the n+ Ge via is epitaxially grown Ge.

14. The array of claim 13 wherein the n+ layer is selected from the group comprising:
   an Antimony (Sb)-doped Ge layer with a thickness of about 10 to 30 nanometers (nm);
   a Sb-doped Silicon oxide (NSG) layer with a thickness of about 50 to 100 nm; and,
   a planarized oxide layer implanted with Sb having a thickness of about 0.01 to 0.05 micrometers; and,
   wherein the array further comprises:
      an n+ via interposed between the first S/D region and the n+ layer.

15. The array of claim 12 wherein the intrinsic Ge layer has a thickness in the range of about 500 to 3000 nm.

16. The array of claim 12 wherein the intrinsic Ge layer is a material selected from the group comprising amorphous Ge and epitaxially grown Ge.

17. The array of claim 12 further comprising:
   a Silicon oxide-filled isolation trench separating adjacent P-I-N diodes.

18. The array of claim 17 wherein the isolation trench has a trench width equal to the minimum feature size of the photodiode array fabrication process.

19. A high-density Germanium (Ge)-on-Insulator (GOI) photodiode array, the array comprising:
   a first plurality of pixel driver pMOST devices with gates connected to a second plurality of row lines in a first orientation, each device having a first source/drain (S/D) region, and a second S/D region connected to Vdd;
a first plurality of N-I-P Ge diodes, each diode comprising:
  a p+ Ge via overlying the first S/D region of a corresponding device;
a p+ layer overlying the p+ Ge via;
an intrinsic Ge layer overlying the p+ layer;
an n+ Ge layer overlying the intrinsic Ge layer; and,
a third plurality of Indium Tin oxide (ITO) columns in a second orientation, about orthogonal to the first orientation, overlying the P-I-N Ge diodes in the second plurality of row lines.

* * * * *